United States Patent
Fujimoto

(10) Patent No.: US 7,924,605 B2
(45) Date of Patent: Apr. 12, 2011

(54) SEMICONDUCTOR MEMORY DEVICE

(75) Inventor: Yukihiro Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 266 days.

(21) Appl. No.: 12/267,241

(22) Filed: Nov. 7, 2008

(65) Prior Publication Data
US 2009/0285040 A1 Nov. 19, 2009

(30) Foreign Application Priority Data
Nov. 8, 2007 (JP) ................................ 2007-291072

(51) Int. Cl.
*G11C 11/00* (2006.01)
(52) U.S. Cl. ........................................ 365/154; 365/156
(58) Field of Classification Search .................. 365/154, 365/156, 230.05
See application file for complete search history.

(56) References Cited

U.S. PATENT DOCUMENTS

| | | | |
|---|---|---|---|
| 6,515,887 B2 * | 2/2003 | Fujimoto | 365/63 |
| 7,123,504 B2 | 10/2006 | Yabe | |
| 7,259,977 B2 * | 8/2007 | Takeyama et al. | 365/63 |
| 7,385,865 B2 * | 6/2008 | Khellah et al. | 365/203 |

* cited by examiner

*Primary Examiner* — Anh Phung
(74) *Attorney, Agent, or Firm* — Sprinkle IP Law Group

(57) ABSTRACT

A semiconductor memory device includes a memory cell array. The memory cell array includes a plurality of sub arrays. Each sub array includes a plurality of memory cells. The memory cell includes a pair of storage nodes that are complementary to each other. One storage node constituting the pair of storage nodes in each of the memory cells in each of the sub arrays is connected to a global bit-line. The other storage node constituting the pair of storage nodes in each of the memory cells in each of the sub arrays is connected to a local bit-line. The global bit-line is a bit-line connected in common to the plurality of the sub arrays. The local bit-line is provided for each of the sub arrays.

18 Claims, 4 Drawing Sheets

SEMICONDUCTOR MEMORY DEVICE

CROSS REFERENCE TO RELATED APPLICATIONS

This application is based on and claims the benefit of priority from prior Japanese Patent Application No. 2007-291072, filed on Nov. 8, 2007, the entire contents of which are incorporated herein by reference.

BACKGROUND OF THE INVENTION

1. Field of the Invention

The present invention relates to a semiconductor memory device, and more particularly, to a static random access memory (SRAM).

2. Description of the Related Art

Large-scale logic LSI includes semiconductor memory devices to temporarily store data. As the scales of systems have recently been increased, automatically-designed logic circuit blocks include a large number of SRAM on a large scale. The SRAM preferably include as few interconnection layers as possible to improve compatibility with designs using the automatic placement and routing.

Conventional SRAM memory cell arrays include memory elements such as memory cells disposed in an array. Each memory cell has a pair of storage nodes that are complementary to each other. A pair of bit-lines is connected to the pair of storage nodes, respectively. Each of the bit-line is connected to a write circuit and a read circuit. When an address signal is input to the semiconductor memory device, an address decoder selects one word-line. The write and read circuits then write/read data from the memory cell connected to the word-line. Data is written/read via the bit-line pair.

In the semiconductor memory device, the bit-line pair is connected to a large number of memory cells. The capacitance load of the bit-line pair is largely increased by the capacitance of the terminals connected to the memory cell storage nodes and the capacitance of the interconnections.

In view of miniaturization, each memory cell includes a small-sized transistor having low driving ability. Each memory cell thus sends only small signals to the bit-lines. Each of the write and read circuits thus includes a sense amplifier to amplify the small amplitude difference between the bit-lines. In the read operation, the bit-lines are set (pre-charged) at the 'H' level. Data is read from the memory cell as the change of the bit-line level. In the write operation, depending on the write data, one of the bit-lines precharged is driven to the ground level. Data is thus written to the memory cell.

In conventional SRAM, the differential sense amplifier detects the small potential difference. Performance dispersion of the devices used in the differential circuit may cause malfunction. Recent decrease of the device size increases the dispersion of the device performance. Additionally, recent decrease of the operating voltage reduces the margin of the potential difference. During the reading operation, both bit-lines are almost kept at the 'H' level. The memory cell having an unstable operating point due to the device dispersion may thus have its data broken.

JP 2002-100187 describes a semiconductor memory device that includes hierarchical bit-lines to reduce their capacitance load without increasing the device area. In the semiconductor memory device described in JP 2002-100187, the memory cell array is divided into a plurality of sub arrays. The bit-lines are hierarchized into a pair of local bit-lines in each of the sub arrays and a global bit-line connected in common to the plurality of the sub arrays. A different pair of local bit-lines reside in each of the sub arrays and are connected to each of the memory cells therein The global bit-line is connected to each of the local bit-line pair. In the memory access, the address decoder selects a memory cell and a sub array including that memory cell. The local bit-lines in the selected sub array is connected to the global bit-line by a switching means. Data may thus be read or written. The capacitance of the memory cell terminals is decreased by a factor of number of the sub arrays. The total capacitance load is thus decreased, improving the operation frequency.

The semiconductor memory device described in JP 2002-100187 includes the hierarchical bit-lines to read data using a complementary metal oxide semiconductor (CMOS) circuit instead of the differential sense amplifier. This may reduce malfunction of the read circuit due to the memory cell dispersion. Unfortunately, the semiconductor memory device described in JP 2002-100187 includes the additional global bit-line, increasing the number of bit-lines per bit from two to three. Usually, the memory cell optimized to have the smallest area may include only two bit-lines. It is thus necessary to layout the global bit-line using a different interconnection layer. This increases the number of interconnection layers included in the SRAM circuit. The design using the automatic placement and routing technique should thus use one less interconnection layer in the SRAM circuit area than in the other areas.

SUMMARY OF THE INVENTION

According to an aspect of the present invention, a semiconductor memory device comprises: a memory cell array comprising a plurality of sub arrays, each sub array comprising a plurality of memory cells, the memory cell comprising a pair of storage nodes that are complementary to each other; a first bit-line connected to one storage node constituting the pair of storage nodes in each of the memory cells in each of the sub arrays; and a second bit-line connected to the other storage node constituting the pair of storage nodes in each of the memory cells in each of the sub arrays, wherein the first bit-line is a bit-line connected in common to the plurality of the sub arrays, and the second bit-line is provided for each of the sub arrays.

According to another aspect of the present invention, a semiconductor memory device comprises: a memory cell array comprising a plurality of memory cells, the memory cell comprising a pair of storage nodes that are complementary to each other; a first bit-line connected to one storage node constituting the pair of storage nodes in each of the memory cells in the memory cell array; a second bit-line connected to the other storage node constituting the pair of storage nodes in each of the memory cells in the memory cell array; wherein the first bit-line is a bit-line connected in common to the plurality of the memory cells, and the second bit-line is connected to fewer memory cells than the first bit-line.

According to another aspect of the present invention, a semiconductor memory device comprises: a memory cell array comprising a plurality of sub arrays, each sub array comprising a plurality of memory cells, the memory cell comprising a pair of storage nodes that are complementary to each other; a first bit-line as a bit-line connected in common to the plurality of the sub arrays, the first bit-line being connected to one storage node constituting the pair of storage nodes in each of the memory cells in each of the sub arrays; a second bit-line provided in each of the sub arrays, the second bit-line being connected to the other storage node constituting the pair of storage nodes in each of the memory cells in each of the sub arrays; a first read circuit provided in each of the sub arrays, the first read circuit having an input end connected to the second bit-line and an output end connected to the first bit-line; a second read circuit having an input end connected to the first bit-line and an output end for outputting data read from the memory cell; a first write circuit provided in each of the sub arrays, the first write circuit having an input end connected to the first bit-line and an output end connected to the second bit-line; and a second write circuit having an input end for receiving data to be written to each of the memory cells and an output end connected to the first bit-line, wherein the first read circuit transfers data to the first bit-line, the data being read from the memory cell through the second bit-line, and the second read circuit outputs data, the data being read from the memory cell through the first bit-line, and wherein the second write circuit drives the first bit-line using data to be written to each of the memory cells, and the first write circuit drives the second bit-line using data received through the first bit-line, the data being to be written to each of the memory cells.

DETAILED DESCRIPTION OF THE EMBODIMENTS

Figure 1:
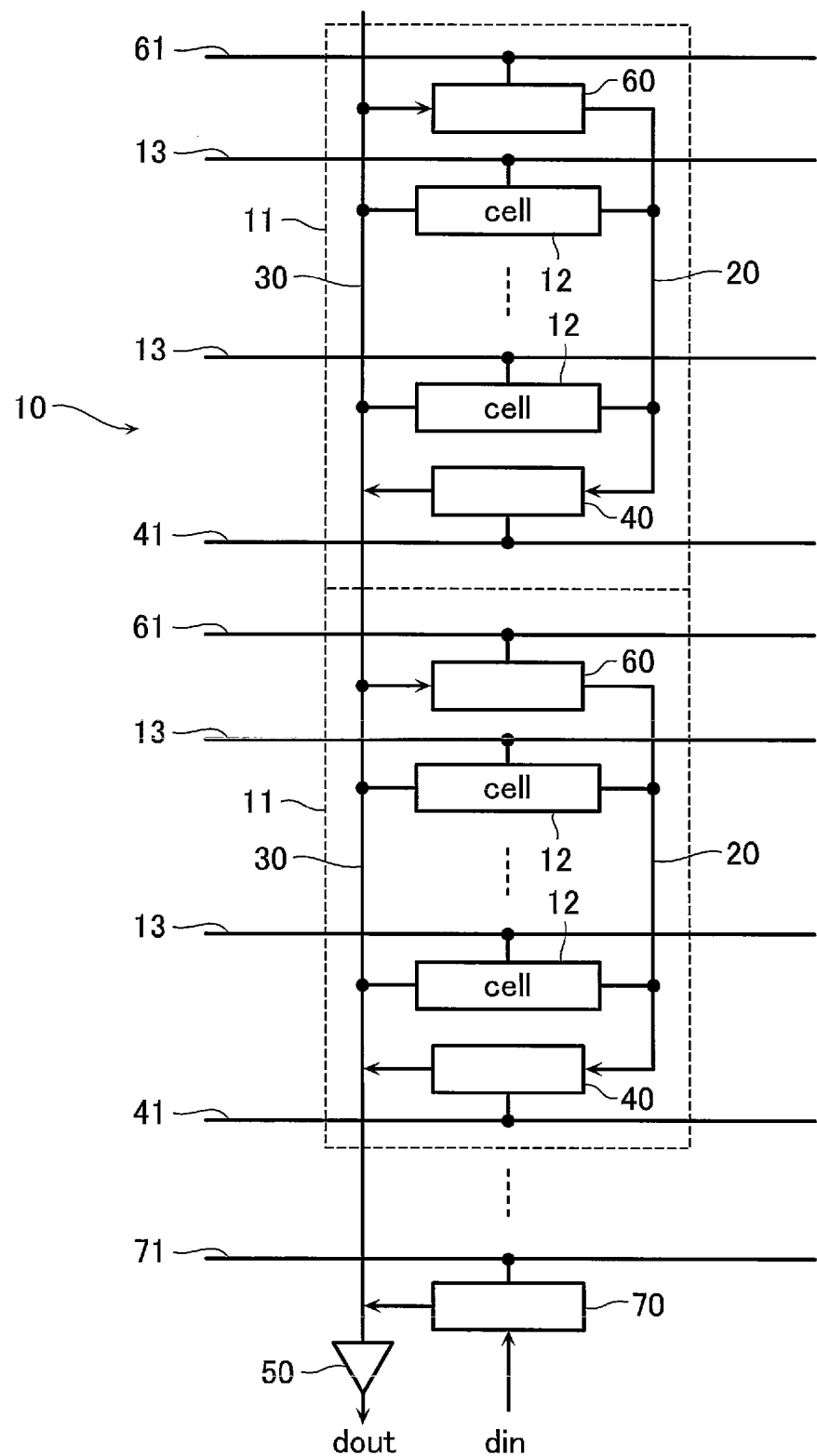
FIG. 1 is a block diagram of a semiconductor memory device according to a first embodiment.

With reference to the accompanying drawings, a semiconductor memory device according to a first embodiment of the present invention will be described. FIG. 1 is a block diagram of the semiconductor memory device according to the first embodiment of the present invention.

In FIG. 1, the semiconductor memory device includes a memory cell array 10. The array 10 is divided into a plurality of sub arrays 11. Each sub array 11 includes a plurality of memory elements such as memory cells 12 arranged therein. In each sub array 11, each memory cell 12 is connected to a different word-line 13. In one sub array 11, each memory cell 12 has a pair of storage nodes that are complementary to each other. The storage nodes are connected to different terminals. One terminal is connected to a local bit-line 20. The other terminal is connected to a global bit-line 30. The global bit-line 30 is a bit-line common to each sub array 11. Different local bit-lines 20 are provided in different sub arrays 11. Specifically, each local bit-line 20 is connected to a certain number of memory cells 12 in the sub array 11, and the global bit-line 30 is connected to more memory cells 12 than those connected to each local bit-line 20.

Each local bit-line 20 has one end connected to a local read circuit 40, which in turn is connected to the global bit-line 30. Each local read circuit 40 is controlled by a different global bit-line drive control line 41. Each local bit-line 20 has the other end connected to a local write circuit 60, which in turn is connected to the global bit-line 30. Each local write circuit 60 is controlled by a different local write control line 61. The global bit-line 30 is connected to a global read circuit 50 and a global write circuit 70. The global write circuit 70 is controlled by a global write control line 71. Each local read circuit 40 and each global read circuit 50 include a CMOS circuit. The configurations of the local read circuit 40, the local write circuit 60, the global read circuit 50, and the global write circuit 70 will be described in more detail below.

Data read operation and write operation in the semiconductor memory device will now be described.

In the data read operation by the semiconductor memory device, a not-shown address decoder selects the word-line 13 of the memory cell 12 from which data is to be read. From the memory cell 12 activated by the selected word-line 13, data is transferred to the local read circuit 40 via the local bit-line 20. A signal of the global bit-line drive control line 41 causes data in the local read circuit 40 to be transferred to the global bit-line 30. The data is then read to a data output terminal "dout" via the global read circuit 50.

In the data write operation by the semiconductor memory device, a signal of the global write control line 71 causes data of a data input terminal "din" to be transferred to the global bit-line 30 via the global write circuit 70. A signal of the local write control line 61 causes the data to be transferred from the global bit-line 30 to the local bit-line 20 via the local write circuit 60. At the same time, the not-shown address decoder selects the word-line 13 of the memory cell 12 to which data is to be written and thus activates the memory cell 12. The data transferred by the global bit-line 30 and the local bit-line 20 is written to that memory cell 12.

In the semiconductor memory device in this embodiment, one sub array 11 includes two bit-lines. Compared to a conventional semiconductor memory device including a pair of bit-lines and the global bit-line, therefore, the number of bit-lines may be reduced by one. This may provide a more compact semiconductor memory device and increase the degree of freedom of the interconnection layout in the semiconductor memory device.

Additionally, because read and write to each memory cell 12 are performed in one sub array 11, fewer memory cells 12 are connected to one local bit-line 20. The capacitance load of the interconnection may thus be decreased. The CMOS circuit rather than the differential sense amplifier may thus read data. This may reduce malfunction due to the memory cell dispersion during the read operation.

Figure 2:
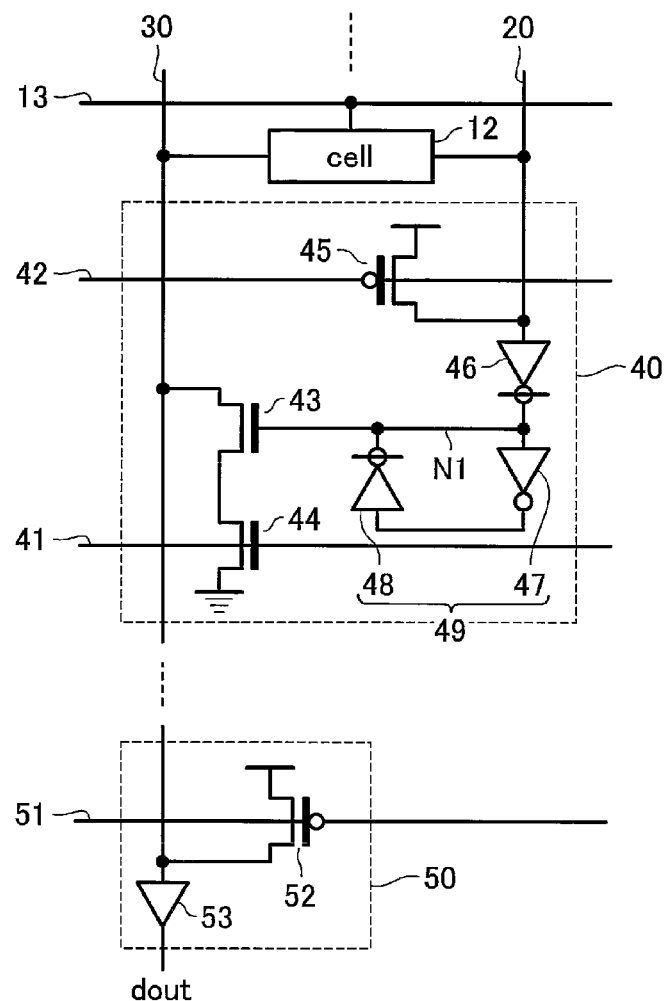
FIG. 2 is a circuit diagram of the configuration of a local read circuit and a global read circuit in the semiconductor memory device according to the first embodiment.
Figure 3:
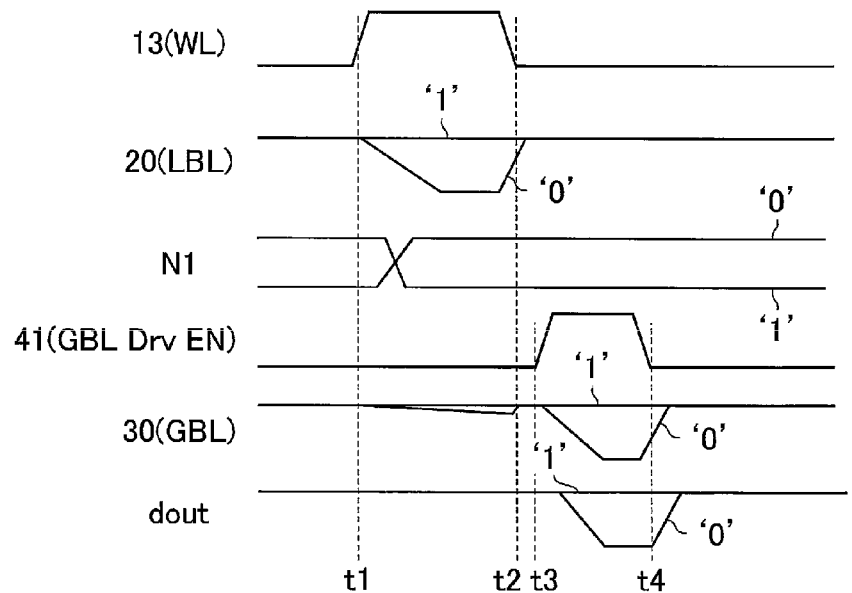
FIG. 3 is a timing diagram for reading data using the local and global read circuits in FIG. 2.

With reference to the accompanying drawings, a detailed description is given of the local and global read circuits 40 and 50 in the semiconductor memory device according to the first embodiment of the present invention. FIG. 2 is a circuit diagram of the configurations of the local and global read circuits 40 and 50 in the semiconductor memory device in the first embodiment. FIG. 3 is a timing diagram for reading data from the memory cell 12 using the local and global read circuits 40 and 50 in FIG. 2.

In the semiconductor memory device in FIG. 2, the local read circuit 40 includes NMOS transistors 43 and 44, a PMOS transistor 45, and inverter circuits 46 to 48. Each of the inverter circuits 46 to 48 in the local read circuit 40 includes a CMOS circuit that includes complementarily connected PMOS and NMOS transistors. The inverter circuit 46 has an input end connected to the local bit-line 20. The inverter circuit 46 also has an output end connected to the node N1 of a latch circuit 49. The circuit 49 includes the inverter circuits 47 and 48. The gate of the PMOS transistor 45 is connected to a local bit-line precharge signal line 42. The drain of the PMOS transistor 45 is connected to the input end of the inverter circuit 46. The source of the PMOS transistor 45 is connected to the power supply. The input end of the inverter circuit 47 is connected to the output end of the inverter circuit 48. The output end of the circuit 47 is connected to the input end of the circuit 48. The circuits 47 and 48 thus connected comprise the latch circuit 49. The node N1 of the latch circuit 49 is connected to the gate of the NMOS transistor 43. The drain of the NMOS transistor 43 is connected to the global bit-line 30. The source of the NMOS transistor 43 is connected to the drain of the NMOS transistor 44. The gate of the NMOS transistor 44 is connected to the global bit-line drive control line 41. The source of the NMOS transistor 44 is grounded.

In the semiconductor memory device in FIG. 2, the global read circuit 50 includes a PMOS transistor 52 and a buffer circuit 53. The buffer circuit 53 in the global read circuit 50 includes a CMOS circuit. The buffer circuit 53 has an input end connected to the global bit-line 30. The circuit 53 also has an output end connected to the data output terminal "dout." The gate of the PMOS transistor 52 is connected to a global bit-line precharge signal line 51. The drain of the PMOS transistor 52 is connected to the input end of the buffer circuit 53. The source of the PMOS 52 is connected to the power supply.

With reference to the timing diagram in FIG. 3, a description is given of the data read operation using the local and global read circuits 40 and 50 in the semiconductor memory device in FIG. 2.

Reading '1' from the memory cell 12 is described below. If the memory cell 12 stores '1', the pair of storage nodes that are complementary to each other in the memory cell 12 are charged as follows. The node on the global bit-line 30 side is held at the 'L' level. The node on the local bit-line 20 side is held at the 'H' level. In the read operation, the potentials of the global and local bit-line precharge signal lines 51 and 42 are both at the 'L' level, and the global and local bit-lines 30 and 20 are precharged to the 'H' level. Next at time t1, the not-shown address decoder selects the word-line 13 of the memory cell 12 from which data is to be read. The selected word-line 13 activates the one memory cell 12 from which data is to be read. The storage node on the local bit-line 20 side of the selected memory cell 12 holds the 'H' level. The local bit-line 20 is driven while it remains at the 'H' level. The 'H' level is transferred to the local read circuit 40. After being input to the local read circuit 40, the 'H' level is inverted by the inverter circuit 46 to the 'L' level. The 'L' level is then stored at the node N1 of the latch circuit 49. At time t2, the word-line 13 is set at the 'L' level to inactivate the memory cell 12 from which data is to be read. At time t3, with data held in the latch circuit 49, the global bit-line drive control line 41 is driven to the 'H' level. The node N1 of the latch circuit 49 is, however, at the 'L' level. The NMOS transistor 43 is thus not rendered conductive. The global bit-line 30 remains at the precharged 'H' level. The 'H' level kept at the global bit-line 30 is transferred to the data output terminal "dout" through the buffer circuit 53. The data of '1' is thus read. At time t4, the global bit-line drive control line 41 is set at the 'L' level to stop the data read operation.

Reading '0' from the memory cell 12 is now described. If the memory cell 12 stores '0', the pair of storage nodes that are complementary to each other in the memory cell 12 are charged as follows. The node on the global bit-line 30 side is held at the 'H' level. The node on the local bit-line 20 side is held at the 'L' level. In the read operation, the potentials of the global and local bit-line precharge signal lines 51 and 42 are both at the 'L' level, and the global and local bit-lines 30 and 20 are precharged to the 'H' level. Next at time t1, the not-shown address decoder selects the word-line 13 of the memory cell 12 from which data is to be read. The selected word-line 13 activates the one memory cell 12 from which data is to be read. The storage node on the local bit-line 20 side of the selected memory cell 12 holds the 'L' level. The local bit-line 20 is thus driven to the 'L' level. The 'L' level is transferred to the local read circuit 40. After being input to the local read circuit 40, the 'L' level is inverted by the inverter circuit 46 to the 'H' level. The 'H' level is then stored at the node Ni of the latch circuit 49. At time t2, the word-line 13 is set at the 'L' level to inactivate the memory cell 12 from which data is to be read. At time t3, with data held in the latch circuit 49, the global bit-line drive control line 41 is driven to the 'H' level. The node N1 of the latch circuit 49 is also at the 'H' level. The NMOS transistors 43 and 44 are thus rendered conductive. The global bit-line 30 changes from the precharged 'H' level to the 'L' level. The 'L' level of the global bit-line 30 is transferred to the data output terminal "dout" through the buffer circuit 53. The data of '0' is thus read. At time t4, the global bit-line drive control line 41 is set at the 'L' level to stop the data read operation.

One local read circuit 40 resides in each sub array 11. A transistor having high driving ability may thus be used as the buffer. The global bit-line 20 may therefore be driven with a circuit at the CMOS level. In this configuration, each of the local and global read circuits 40 and 50 may then include a CMOS circuit without increasing the number of bit-lines. No differential sense amplifier is used. This may reduce wrong reading due to the device performance dispersion. Data may thus be read reliably.

Figure 4:
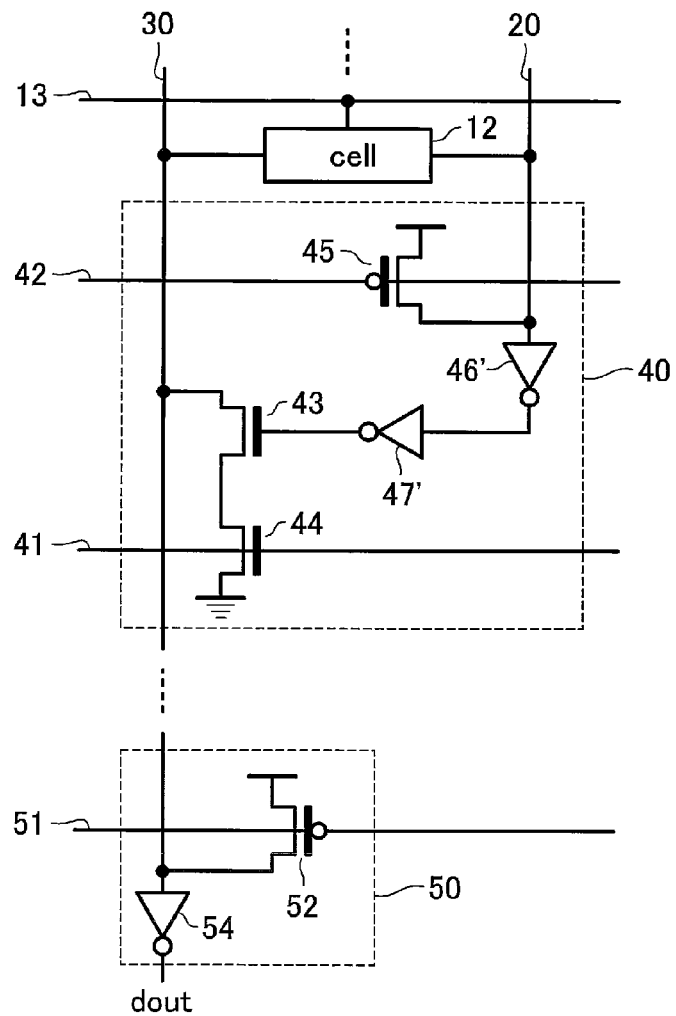
FIG. 4 is a circuit diagram of the configuration of another example of the local and global read circuits in the semiconductor memory device according to the first embodiment.
Figure 5:
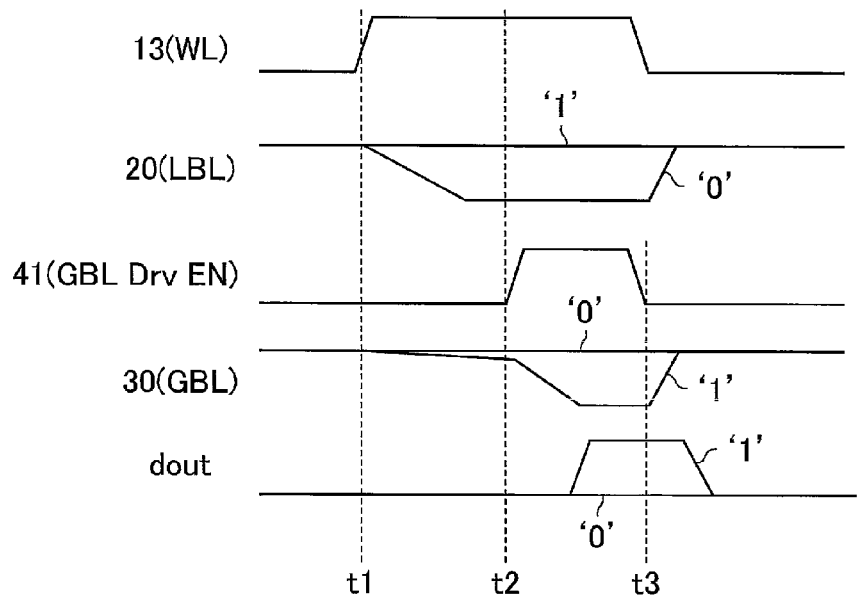
FIG. 5 is a timing diagram for reading data using the local and global read circuits in FIG. 4.

With reference to the accompanying drawings, a detail description is given of other examples of the local and global read circuits 40 and 50 in the semiconductor memory device according to the first embodiment of the present invention. FIG. 4 is a circuit diagram of the configurations of other examples of the local and global read circuits 40 and 50 of the semiconductor memory device in the first embodiment. FIG. 5 is a timing diagram for reading data from the memory cell using the local and global read circuits 40 and 50 in FIG. 4.

In the semiconductor memory device in FIG. 4, the local read circuit 40 includes the NMOS transistors 43 and 44, the PMOS transistor 45, and inverter circuits 46' and 47'. Each of the inverter circuits 46' and 47' in the local read circuit 40 includes a CMOS circuit that includes complementarily connected PMOS and NMOS transistors. The inverter circuit 46' has an input end connected to the local bit-line 20. The inverter circuit 46' also has an output end connected to the input end of the inverter circuit 47'. The gate of the PMOS transistor 45 is connected to the local bit-line precharge signal line 42. The drain of the PMOS transistor 45 is connected to the input end of the inverter circuit 46'. The source of the PMOS 45 is connected to the power supply. The inverter circuit 47' has an output end connected to the gate of the NMOS transistor 43. The drain of the NMOS transistor 43 is connected to the global bit-line 30. The source of the NMOS transistor 43 is connected to the drain of the NMOS transistor 44. The gate of the NMOS transistor 44 is connected to the global bit-line drive control line 41. The source of the NMOS transistor 44 is grounded.

In the semiconductor memory device in FIG. 4, the global read circuit 50 includes the PMOS transistor 52 and an inverter circuit 54. Like the inverter circuits 46' and 47', the inverter circuit 54 in the global read circuit 50 includes a CMOS circuit. The inverter circuit 54 has an input end connected to the global bit-line 30. The circuit 54 also has an output end connected to the data output terminal "dout." The gate of the PMOS transistor 52 is connected to the global bit-line precharge signal line 51. The drain of the PMOS transistor 52 is connected to the input end of the inverter circuit 54. The source of the PMOS 52 is connected to the power supply.

With reference to the timing diagram in FIG. 5, a description is given of the data read operation using the local and global read circuits 40 and 50 in the semiconductor memory device in FIG. 4.

Reading '1' from the memory cell 12 is described below. If the memory cell 12 stores '1', the pair of storage nodes that are complementary to each other in the memory cell 12 are charged as follows. The node on the global bit-line 30 side is held at the 'L' level. The node on the local bit-line 20 side is held at the 'H' level. In the read operation, the potentials of the global and local bit-line precharge signal lines 51 and 42 are both at the 'L' level, and the global and local bit-lines 30 and 20 are precharged to the 'H' level. Next at time t1, the not-shown address decoder selects the word-line 13 of the memory cell 12 from which data is to be read. The selected word-line 13 activates the one memory cell 12 from which data is to be read. The storage node on the local bit-line 20 side of the selected memory cell 12 holds the 'H' level. The local bit-line 20 is driven while it remains at the 'H' level. The 'H' level is transferred to the local read circuit 40. After being input to the local read circuit 40, the 'H' level is sent through the inverter circuits 46' and 47' and is input to the gate of NMOS transistor 43. At time t2, the word-line 13 remains selected by the address decoder and thus the memory cell 12 is activated. The global bit-line drive control line 41 is then driven to the 'H' level. The gate of the NMOS transistor 43 is at the 'H' level. The NMOS transistors 43 and 44 are thus rendered conductive. The global bit-line 30 changes from the precharged 'H' level to the 'L' level. The 'L' level of the global bit-line 30 is inverted by the inverter circuit 54 in the global read circuit 50 to the 'H' level. The 'H' level is then transferred to the data output terminal "dout." The data '1' is thus read. At time t3, the global bit-line drive control line 41 is set at the 'L' level to stop the data read operation. During the data read, the memory cell 12 remains activated. In the data read, however, the global bit-line 30 is driven to the 'L' level and the local bit-line 20 is driven to the 'H' level. It is thus less likely to write wrong data to the memory cell 12.

Reading '0' from the memory cell 12 is now described. If the memory cell 12 stores '0', the pair of storage nodes that are complementary to each other in the memory cell 12 are charged as follows. The node on the global bit-line 30 side is held at the 'H' level. The node on the local bit-line 20 side is held at the 'L' level. In the read operation, the potentials of the global and local bit-line precharge signal lines 51 and 42 are both at the 'L' level, and the global and local bit-lines 30 and 20 are precharged to the 'H' level. Next at time t1, the not-shown address decoder selects the word-line 13 of the memory cell 12 from which data is to be read. The selected word-line 13 activates the one memory cell 12 from which data is to be read. The storage node on the local bit-line 20 side of the selected memory cell 12 holds the 'L' level. The local bit-line 20 is thus driven to the 'L' level. The 'L' level is transferred to the local read circuit 40. After being input to the local read circuit 40, the 'L' level is sent through the inverter circuits 46' and 47' and is input to the gate of NMOS transistor 43. At time t2, the word-line 13 remains selected by the address decoder and thus the memory cell 12 is activated. The global bit-line drive control line 41 is then driven to the 'H' level. The gate of the NMOS transistor 43 is, however, held at the 'L' level. The NMOS transistor 43 is thus not rendered conductive. The global bit-line 30 remains at the precharged 'H' level. The 'H' level held at the global bit-line 30 is inverted by the inverter circuit 54 in the global read circuit 50 to the 'H' level. The 'H' level is then transferred to the data output terminal "dout." The data '0' is thus read. At time t3, the global bit-line drive control line 41 is set at the 'L' level to stop the data read operation. During the data read, the memory cell 12 remains activated. In the data read, however, the global bit-line 30 is driven to the 'H' level and the local bit-line 20 is driven to the 'L' level. It is thus less likely to write wrong data to the memory cell 12.

Also in this configuration, each of the local and global read circuits 40 and 50 may include a CMOS circuit without increasing the number of bit-lines. No differential sense amplifier is used. This may reduce wrong reading due to the device performance dispersion. Data may thus be read reliably.

In this example, the local read circuit 40 includes two inverter circuits 46' and 47'. Alternatively, the circuits 46' and 47' may be removed. The local read circuit 40 may thus be more simply configured.

Figure 6:
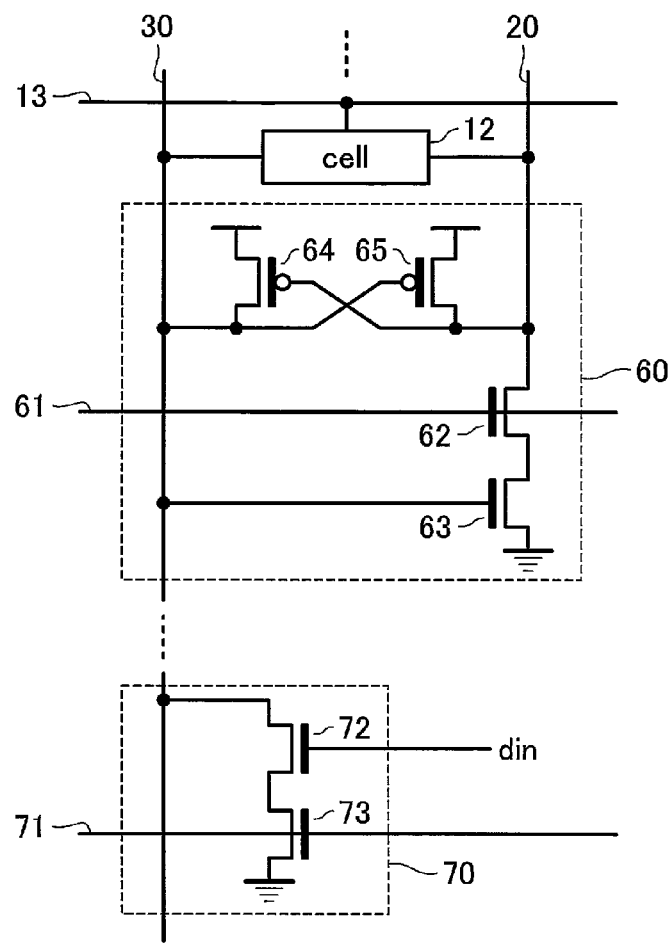
FIG. 6 is a circuit diagram of the configuration of a local write circuit and a global write circuit in the semiconductor memory device according to the first embodiment.
Figure 7:
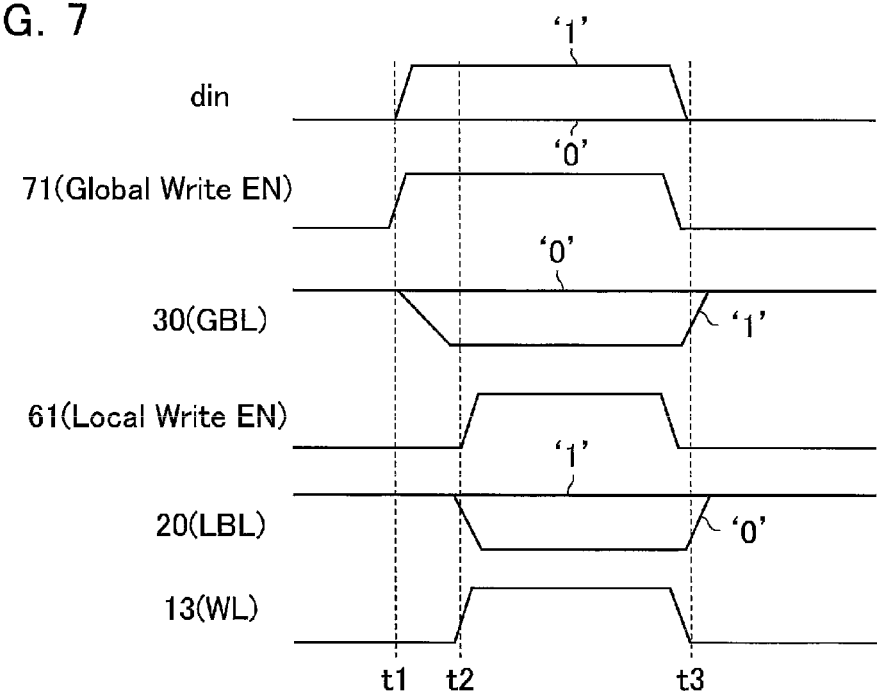
FIG. 7 is a timing diagram for writing data using the local and global write circuits in FIG. 6.

With reference to the accompanying drawings, a detailed description is given of the local write circuit 60 and the global write circuit 70 in the semiconductor memory device according to the first embodiment of the present invention. FIG. 6 is a circuit diagram of the configurations of the local and global write circuits 60 and 70 in the semiconductor memory device in the first embodiment. FIG. 7 is a timing diagram for writing data in the memory cell 12 using the local and global write circuits 60 and 70 in FIG. 6.

In the semiconductor memory device in FIG. 6, the local write circuit 60 includes NMOS transistors 62 and 63 and PMOS transistors 64 and 65. The gate of the NMOS transistor 62 is connected to the local write control line 61. The drain of the NMOS transistor 62 is connected to the local bit-line 20. The source of the NMOS 62 is connected to the drain of the NMOS transistor 63. The gate of the NMOS transistor 63 is connected to the global bit-line 30. The drain of the NMOS transistor 63 is connected to the source of the NMOS transistor 62. The source of NMOS 63 is grounded. The gate of the PMOS transistor 64 is connected to the drain of the PMOS transistor 65. The gate of the PMOS 65 is connected to the drain of the PMOS 64. The sources of the PMOS transistors 64 and 65 are both connected to the power supply. The two PMOS transistors 64 and 65 comprise a cross-coupled precharge circuit.

In the semiconductor memory device in FIG. 6, the global write circuit 70 includes NMOS transistors 72 and 73. The gate of the NMOS transistor 72 is connected to the data input terminal "din." The drain of the NMOS transistor 72 is connected to the global bit-line 30. The source of the NMOS 72 is connected to the drain of the NMOS transistor 73. The gate of the NMOS transistor 73 is connected to the global write control line 71. The source of the NMOS 73 is grounded.

With reference to the timing diagram in FIG. 7, a description is given of the data write operation using the local and global write circuits 60 and 70 in the semiconductor memory device in FIG. 6.

Writing '1' to the memory cell 12 is described below. In the write operation, the cross-coupled precharge circuit precharges the global and local bit-lines 30 and 20 to the 'H' level. Next at time t1, the data input terminal "din" is set at the 'H' level to write '1' to the memory cell 12. The global write control line 71 in the global write circuit 70 is then driven by the global write control signal. The gates of the NMOS transistors 72 and 73 are both held at the 'H' level. The NMOS transistors 72 and 73 are thus rendered conductive. The global bit-line 30 changes from the precharged 'H' level to the 'L' level. Next at time t2, the local write control line 61 in the local write circuit 60 in each sub array 11 is driven to the 'H' level by the local write control signal. The gate of the NMOS transistor 63 is connected, however, to the global bit-line 30 held at the 'L' level. The NMOS transistor 63 is thus not rendered conductive. The local bit-line 20 is held at the precharged 'H' level. The not-shown address decoder selects the word-line 13 of the memory cell 12 from which data is to be read. The selected word-line 13 activates the one memory cell 12 to which data is to be written. If the memory cell 12 stores '1', the pair of storage nodes that are complementary to each other in the memory cell 12 are charged as follows. The node on the global bit-line 30 side is held at the 'L' level. The node on the local bit-line 20 side is held at the 'H' level. At time t3, the global write control line 71, the local write control line 61, and the word-line 13 are set at the 'L' level to stop the data write operation.

Writing '0' to the memory cell 12 is now described. In the write operation, the cross-coupled precharge circuit precharges the global and local bit-lines 30 and 20 to the 'H' level. Next at time t1, the data input terminal "din" is set at the 'L' level to write '0' to the memory cell 12. The global write control line 71 in the global write circuit 70 is then driven by the global write control signal. The gate of the NMOS transistor 72 is held at the 'L' level. The NMOS transistor 72 is thus not rendered conductive. The global bit-line 30 is held at the precharged 'H' level. Next at time t2, the local write control line 61 in the local write circuit 60 in each sub array 11 is driven to the 'H' level by the local write control signal. The gate of the NMOS transistor 63 is connected, however, to the global bit-line 30 held at the 'H' level. The NMOS transistors 62 and 63 are thus rendered conductive. The local bit-line 20 changes from the precharged 'H' level to the 'L' level. The not-shown address decoder selects the word-line 13 of the memory cell 12 from which data is to be read. The selected word-line 13 activates the one memory cell 12 to which data is to be written. If the memory cell 12 stores '0', the pair of storage nodes that are complementary to each other in the memory cell 12 are charged as follows. The node on the global bit-line 30 side is held at the 'H' level. The node on the local bit-line 20 side is held at the 'L' level. At time t3, the global write control line 71, the local write control line 61, and the word-line 13 are set at the 'L' level to stop the data write operation.

This configuration may provide a semiconductor memory device that may reliably write data without increasing the number of bit-lines.

In the semiconductor memory device according to the embodiments of the present invention, the memory cell array 11 may include two bit-lines. In this condition, the memory cell data may be read using a circuit at the CMOS level. A semiconductor memory device may thus be provided that has an improved operation margin of the memory circuit.

Thus, although the invention has been described with respect to particular embodiments thereof, it is not limited to those embodiments. It will be understood that various modifications and additions and the like may be made without departing from the spirit of the present invention.

What is claimed is:

1. A semiconductor memory device, comprising:
   a memory cell array comprising a plurality of sub arrays, each sub array comprising a plurality of memory cells, the memory cell comprising a pair of storage nodes that are complementary to each other;
   a first bit-line connected to one storage node constituting the pair of storage nodes in each of the memory cells in each of the sub arrays;
   a second bit-line connected to the other storage node constituting the pair of storage nodes in each of the memory cells in each of the sub arrays;
   a first read circuit provided in each of the sub arrays, the first read circuit having an input end connected to the second bit-line and an output end connected to the first bit-line, and
   a second read circuit having an input end connected to the first bit-line and an output, end for outputting data read from the memory cell, wherein
   the first bit-line is a bit-line connected in common to the plurality of the sub arrays,
   the second bit-line is provided for each of the sub arrays,
   the first read circuit transfers data to the first bit-line, the data being read from the memory cell through the second bit-line, and
   the second read circuit outputs data, the data being read from the memory cell through the first bit-line.

2. The semiconductor memory device according to claim 1, wherein
   each of the first and second read circuits comprises a CMOS circuit.

3. The semiconductor memory device according to claim 1, wherein
   the first read circuit comprises a latch circuit that temporarily holds data read from the memory cell through the second bit-line.

4. The semiconductor memory device according to claim 1, wherein
   the memory cell remains activated while data is read by the first and second read circuits.

5. The semiconductor memory device according to claim 1, further comprising
   a first write circuit provided in each of the sub arrays, the first write circuit having an input end connected to the first bit-line and an output end connected to the second bit-line, and
   a second write circuit having an input end for receiving data to be written to each of the memory cells and an output end connected to the first bit-line, wherein
   the second write circuit drives the first bit-line using data to be written to each of the memory cells, and the first write circuit drives the second bit-line using data received through the first bit-line, the data being to be written to each of the memory cells.

6. The semiconductor memory device according to claim 5, wherein
   the first write circuit further comprises a cross-coupled type precharge circuit that precharges the first and second bit-lines in the write operation, and the first or second write circuit writes data to each of the memory cells by driving one of the precharged first and second bit-lines from a precharged 'H' level to an 'L' level.

7. The semiconductor memory device according to claim 1, wherein
   each of the memory cells is an SRAM cell.

8. A semiconductor memory device, comprising:
   a memory cell array comprising a plurality of memory cells, the memory cell comprising a pair of storage nodes that are complementary to each other;
   a first bit-line connected to one storage node constituting the pair of storage nodes in each of the memory cells in the memory cell array;

a second bit-line connected to the other storage node constituting the pair of storage nodes in each of the memory cells in the memory cell array;

a first read circuit having an input end connected to the second bit-line and an output end connected to the first bit-line, and a second read circuit having an input end connected to the first bit-line and an output end for outputting data read from each of the memory cells, wherein the first bit-line is a bit-line connected in common to the plurality of the memory cells, the second bit-line is connected to fewer memory cells than the first bit-line, the first read circuit transfers data to the first bit-line, the data being read from the memory cell through the second bit-line, and the second read circuit outputs data, the data being read from the memory cell through the first bit-line.

9. The semiconductor memory device according to claim 8, wherein each of the first and second read circuits comprises a CMOS circuit.

10. The semiconductor memory device according to claim 8, wherein the first read circuit comprises a latch circuit that temporarily holds data read from the memory cell through the second bit-line.

11. The semiconductor memory device according to claim 8, wherein the memory cell remains activated while data is read by the first and second read circuits.

12. The semiconductor memory device according to claim 8, further comprising a first write circuit having an input end connected to the first bit-line and an output end connected to the second bit-line, and a second write circuit having an input end for receiving data to be written to each of the memory cells and an output end connected to the first bit-line, wherein the second write circuit drives the first bit-line using data to be written to each of the memory cells, and the first write circuit drives the second bit-line using data received through the first bit-line, the data being to be written to each of the memory cells.

13. The semiconductor memory device according to claim 12, wherein the first write circuit further comprises a cross-coupled type precharge circuit that precharges the first and second bit-lines in the write operation, and the first or second write circuit writes data to each of the memory cells by driving one of the precharged first and second bit-lines from a precharged 'H' level to an 'L' level.

14. A semiconductor memory device comprising:

a memory cell array comprising a plurality of sub arrays, each sub array comprising a plurality of memory cells, the memory cell comprising a pair of storage nodes that are complementary to each other;

a first bit-line as a bit-line connected in common to the plurality of the sub arrays, the first bit-line being connected to one storage node constituting the pair of storage nodes in each of the memory cells in each of the sub arrays;

a second bit-line provided in each of the sub arrays, the second bit-line being connected to the other storage node constituting the pair of storage nodes in each of the memory cells in each of the sub arrays;

a first read circuit provided in each of the sub arrays, the first read circuit having an input end connected to the second bit-line and an output end connected to the first bit-line;

a second read circuit having an input end connected to the first bit-line and an output end for outputting data read from the memory cell;

a first write circuit provided in each of the sub arrays, the first write circuit having an input end connected to the first bit-line and an output end connected to the second bit-line; and a second write circuit having an input end for receiving data to be written to each of the memory cells and an output end connected to the first bit-line, wherein the first read circuit transfers data to the first bit-line, the data being read from the memory cell through the second bit-line, and the second read circuit outputs data, the data being read from the memory cell through the first bit-line, and wherein the second write circuit drives the first bit-line using data to be written to each of the memory cells, and the first write circuit drives the second bit-line using data received through the first bit-line, the data being to be written to each of the memory cells.

15. The semiconductor memory device according to claim 14, wherein each of the first and second read circuits comprises a CMOS circuit.

16. The semiconductor memory device according to claim 14, wherein the first read circuit comprises a latch circuit that temporarily holds data read from the memory cell through the second bit-line.

17. The semiconductor memory device according to claim 14, wherein the memory cell remains activated while data is read by the first and second read circuits.

18. The semiconductor memory device according to claim 14, wherein the first write circuit further comprises a cross-coupled type precharge circuit that precharges the first and second bit-lines in the write operation, and the first or second write circuit writes data to each of the memory cells by driving one of the precharged first and second bit-lines from a precharged level to an 'L' level.

* * * * *